United States Patent [19]

Navidi et al.

[11] Patent Number: 4,706,038

[45] Date of Patent: Nov. 10, 1987

[54] WIDEBAND LINEAR DARLINGTON CASCODE AMPLIFIER

[75] Inventors: Salar Navidi, Phoneix; Brent L. Trout, Mesa; Fred C. Wernett, Glendale, all of Ariz.

[73] Assignee: Motorola, Inc., Schaumburg, Ill.

[21] Appl. No.: 913,166

[22] Filed: Sep. 29, 1986

[51] Int. Cl.$^4$ .............................................. H03F 3/26
[52] U.S. Cl. .................................... 330/271; 330/276; 330/311
[58] Field of Search ............... 330/262, 271, 275, 276, 330/311

[56] References Cited

U.S. PATENT DOCUMENTS 3,486,126 12/1969 Chin et al. ........................... 330/305

FOREIGN PATENT DOCUMENTS 1290255 9/1972 United Kingdom ................ 330/276

Primary Examiner—James B. Mullins
Attorney, Agent, or Firm—Robert M. Handy

[57] ABSTRACT

This disclosure relates to a multi-channel power amplifier utilizing Darlington pairs as the inputs of a cascode amplifier. The Darlington pair inputs may implement an added grounded resistor to the emitter of the pre-driver transistor in each Darlington pair. The added resistance allows for individual adjustment of the dc current in the pre-driver transistor of each Darlington pair, as well as an additional discharge path for the charges stored on the base of the driver transistor in each pair during a decreasing current state.

15 Claims, 3 Drawing Figures

- PRIOR ART -

WIDEBAND LINEAR DARLINGTON CASCODE AMPLIFIER

BACKGROUND OF THE INVENTION

The present invention pertains to amplifiers, and more specifically, to cable television (CATV) cascode amplifiers that require linear amplification for multi-channel transmission. The stringent specifications for amplifiers in CATV implementations are multi-channel transmission with a wide bandwidth, a gain flatness accurate within several tenths of a decibel, an input and output matched to 75 ohms with at least 18 dB return loss and a noise figure better than about 6 dB. In addition, cross modulation distortion and composite triple beat should be less than certain desired levels, especially at the higher frequency ranges. Although various conventional amplifiers have met some of the specifications alluded to above, improvements are still desired and necessary in the industry. Ideally, a new amplifier should have a lower noise figure, less distortion and more linearity.

SUMMARY OF THE INVENTION

Accordingly, it is an object of the present invention to provide a new and improved amplifier for use in the CATV industry or in other applications that require a linear amplifier for multi-channel transmission.

It is another object of the present invention to provide a new and improved amplifier that will allow more open loop gain and more linearity under closed loop conditions than prior art devices.

A further object of the present invention is to provide a new and improved amplifier which will decrease the high frequency composite triple beat distortion.

Yet another object of the present invention is to provide a new and improved amplifier which produces a lower noise figure than prior art devices.

These objects of the present invention will become apparent to those skilled in the art upon consideration of the accompanying specification, claims and drawings.

In order to attain the above-mentioned and additional objects, the present invention utilizes a push-pull, class A, inversely symmetric amplifier circuit having a pair of cascode devices with Darlington pair inputs. The use of Darlington configurations as the inputs to this type of push-pull amplifier reduces distortion and noise levels. Modified Darlington inputs, having an added resistor connected between ground and the emitter of the pre-driver transistor in each Darlington pair, result in additional advantages if implemented in the present invention. The added resistance of the modified Darlington provides an additional discharge path for the charges stored on the base of the driver transistor of each Darlington pair during the decreasing half cycle of the drive signal on that Darlington pair. The additional resistor also allows independent adjustment of the dc current in the driver transistor of each Darlington pair.

BRIEF DESCRIPTION OF THE DRAWINGS

Referring to the drawings, wherein like characters indicate like parts throughout the figures.

DESCRIPTION OF THE PREFERRED EMBODIMENTS

Figure 1:
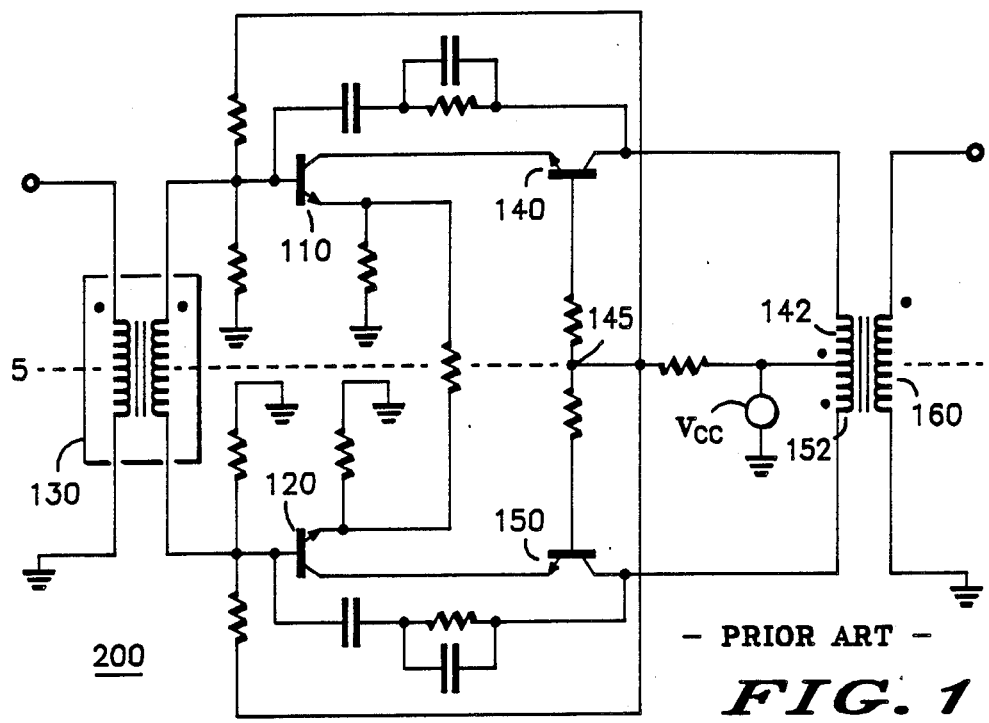
FIG. 1 is a schematic diagram of a prior art cascode push-pull linear amplifier.

Referring specifically to FIG. 1 a prior art push-pull amplifier generally labeled 200 is shown. An input signal source 130 induces opposing signals on the bases of a transistor 110 and a transistor 120. The signal at transistor 110 determines the charge flow through a transistor 140 while the signal at transistor 120 determines the charge flow through a transistor 150. In a push-pull device such as amplifier 200, the signals at the bases of transistors 110 and 120 are 180° out of phase. This phase difference results in signals of equal amplitide and opposite polarity being supplied to transistors 110 and 120. The resultant current through transistors 140 and 150 produces an additive amplified power output through an output transformer winding 160 due to the reference polarities of a winding 142 and a winding 152 in relation to winding 160.

Transistors 110 and 140 are said to be common emitter-common base (CE-CB) cascoded since transistor 110 has a grounded emitter and transistor 140 has a base connected to a virtual ground node 145. Transistors 120 and 150 are considered to be CE-CB cascoded for the same reason. Also, an electrical circuit such as amplifier 200 is often referred to as an inversely symmetric cascoded device since if the circuit is folded along an imaginary center line 5, the circuitry on one side of center line 5 falls directly on top of the circuitry on the other side of center line 5.

Figure 2:
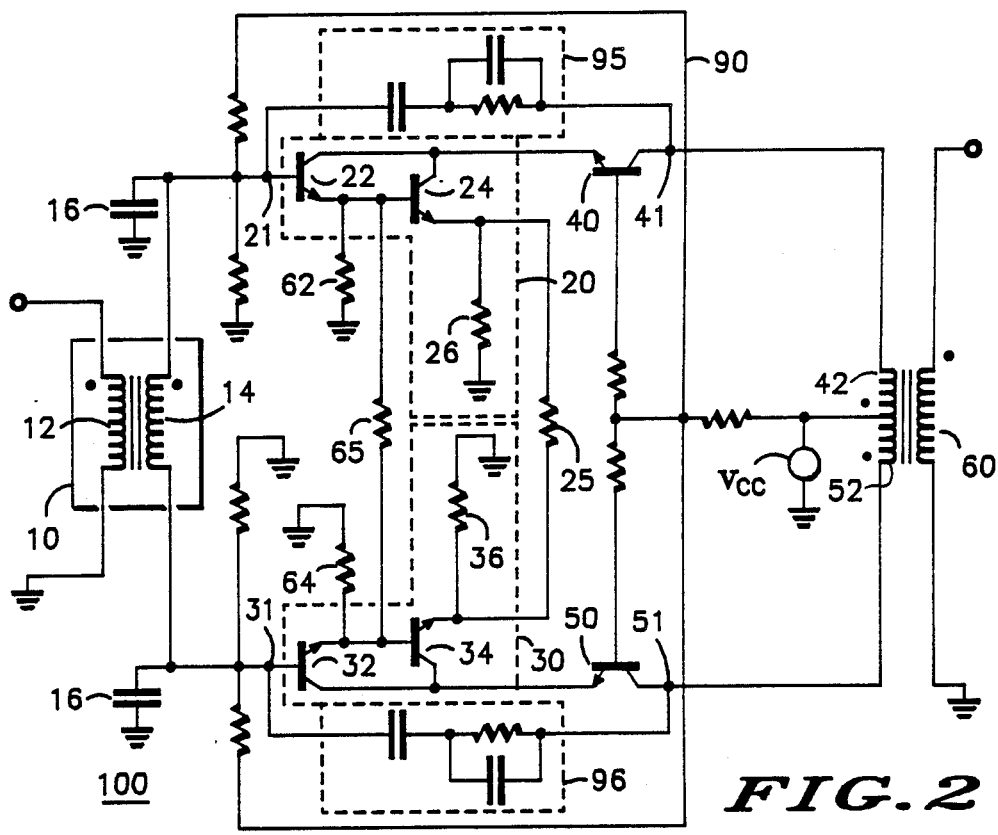
FIG. 2 is a schematic diagram of a cascode push-pull linear amplifier embodying the present invention.

Referring specifically to FIG. 2, a Darlington cascode push-pull amplifier generally labeled 100 is shown. A first coupled transformer 10 supplies signals of opposing phase to a first Darlington pair 20 and a second Darlington pair 30. Transformer 10 possesses a grounded input isolated winding 12 and an input connected winding 14. Darlington pair 20 comprises a pre-driver transistor 22 and a driver transistor 24 whose collectors are tied to each other with the emitter of pre-driver transistor 22 directly coupled to the base of transistor 24. A resistor 26, having one end connected to ground and the other end connected to the emitter of transistor 24, allows for the adjustment of dc current in transistor 24. Darlington pair 30 comprises a pre-driver transistor 32 and a driver transistor 34 whose collectors are tied to each other with the emitter of transistor 32 directly coupled to the base of transistor 34. A resistor 36, having one end connected to ground and the other end connected to the emitter of transistor 34, allows for the adjustment of dc current in transistor 34. Also, resistor 25 joins the emitter of transistor 24 to the emitter of transistor 34 to create an additional path for adjustment of the ac current in transistors 24 and 34 which is independent of the dc path. It should be clear to those skilled in the art that a Darlington pair can be regarded as a compound transistor with three terminals. The base, emitter, and collector of the compound transistor are, respectively, the base of the pre-driver transistor, the emitter of the driver transistor, and the common collectors of the pre-driver and driver transistors.

An in-phase, output transistor 40 is cascoded to Darlington pair 20 with feedback being supplied by a R-C network 95 running from an in-phase, output node 41 to an in-phase input node 21. Similarly, an out-of-phase output transistor 50 is cascoded to Darlington pair 30 with feedback being supplied by a R-C network 96 running from an out-of-phase, output node 51 to an out-of-phase, input node 31. Clearly, R-C networks 95 and 96 can be comprised of various combinations of capacitors and resistors other than the combination illustrated. Numbered elements referred to as "in-phase" or "out-of-phase" are labeled as such to establish, for conceptual purposes, a distinction between the half of inversely symmetric circuit 100 comprising Darlington pair 20 and transistor 40 and the half of inversely symmetric circuit 100 comprising Darlington pair 30 and transistor 50. This labeling is accurate for FIG. 2 since, due to the coupling in transformer 10, node 21 receives an in-phase signal and node 31 receives an out-of-phase signal.

A dc voltage source, $V_{cc}$, is connected through a resistor network to the bases of transistors 40 and 50 and also around an outer loop 90 to the bases of transistors 22 and 32 in order to establish a bias voltage for the transistors. Furthermore, the voltage source, $V_{cc}$, is applied to a transformer winding 42 and a transformer winding 52 which are electrically coupled to a circuit output transformer winding 60. For the purpose of simplicity, windings 42 and 52 are jointly referred to as a split winding attached between positive output node 41 and negative output node 51.

When transformer 10 supplies an increasing amplitude signal to transistor 22 and a decreasing amplitude signal to transistor 32, Darlington pair 20 is in its increasing current state and Darlington pair 30 is in its decreasing current state. At this time, increasing current is drawn from dc voltage source, $V_{cc}$ through transistor 40 from a path passing through transformer winding 42. This charge flow induces an output on circuit output transformer winding 60. At the same time, decreasing current is drawn from $V_{cc}$ through transistor 50 from a path passing through transformer winding 52. This charge flow also induces an output on circuit output transformer winding 60. Thus, the total resultant output on circujt output transformer winding 60 is the sum of the output due to the charge flow through winding 42 and the output due to the charge flow through winding 52.

Conversely, when transformer 10 supplies a increasing amplitude signal to transistor 32 and a decreasing amplitude signal to transistor 22, Darlington pair 30 is in its increasing current state and Darlington pair 20 is in its decreasing current state. At this time, the dc voltage source, $V_{cc}$, results in increasing current being drawn through transistor 50 from a path passing through transformer winding 52. This charge flow induces an output on circuit output transformer winding 60. At the same time, $V_{cc}$ results in decreasing current being drawn through transistor 40 from a path passing through transformer winding 42. This charge flow induces an output on circuit output transformer winding 60 which is added to the output due to the charge flow through winding 52 to yield the resultant amplified output.

It should be apparent to those skilled in the art that the utilization of R-C feedback in CE-CB cascoded devices allows for the amplification of a wider bandwidth of frequencies than cascoded devices not utilizing R-C feedback. Furthermore, optional capacitors 16 may be placed on each side of input connected windings 14, at positive input node 21 and negative input node 31, in order to allow for finer tuning of the input impedance at high frequencies. It should also be apparent that the input signal source supplied to the bases of transistors 22 and 32 may originate from means other than a transformer such as a phase inversion circuit.

Since only one of Darlington pair 20 and Darlington pair 30 is in its increasing current state at any one time, the ability of each pair to discharge stored charges rapidly is highly desirable. A resistor 62, connected from the base of transistor 24 to ground, performs this function for Darlington pair 20 and a resistor 64, connected from the base of transistor 34 to ground, performs this function for Darlington pair 30. Resistor 62 provides an additional discharge path for the charges stored in the base of transistor 24 during the decreasing current state of Darlington pair 20 and similarly, resistor 64 provides an additional discharge path for the charges stored in the base of transistor 34 during the decreasing current state of Darlington pair 30. Resistor 62 also allows for independent adjustment of the dc current in transistor 22 by creating an alternative path for the charges flowing from the emitter of predriver transistor 22 besides into the base of transistor 24. Resistor 64 allows for the same advantage in Darlington pair 30. Additionally, resistor 65 joins the emitter of transistor 22 to the emitter of transistor 32 to create a path for adjustment of ac current in transistors 22 and 32.

Figure 3:
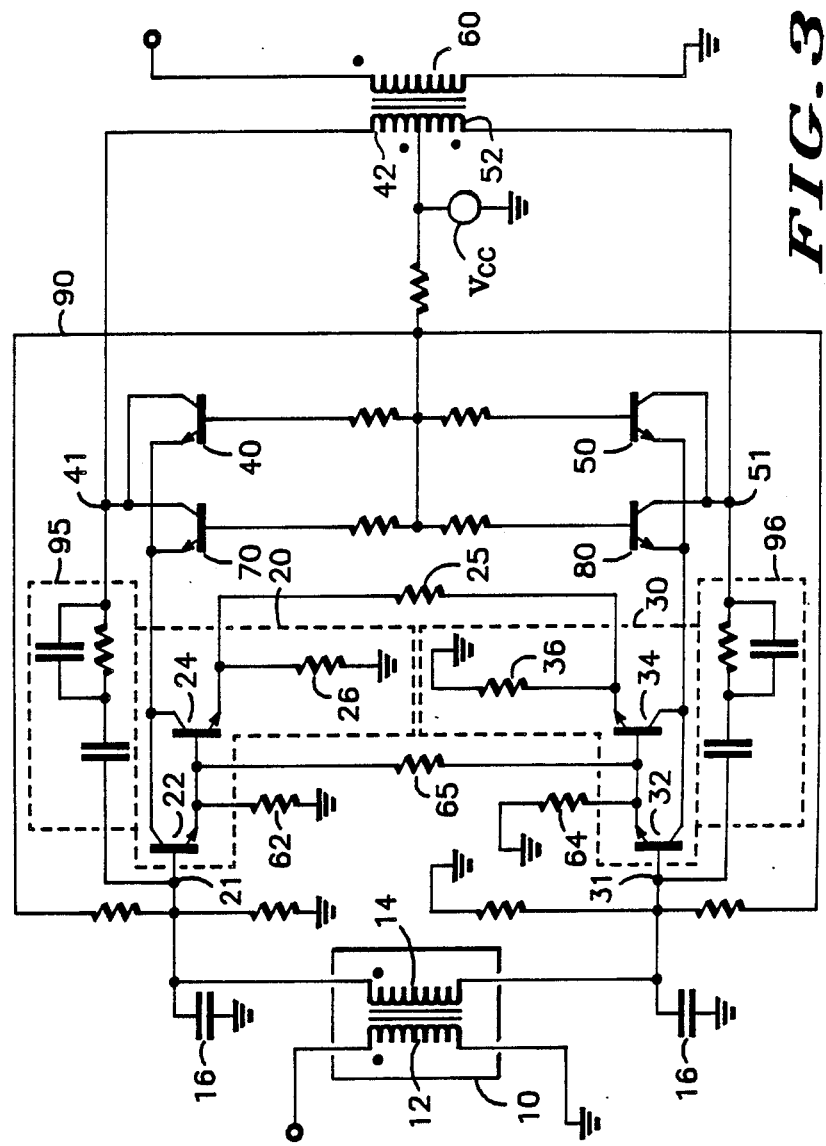
FIG. 3 is a schematic diagram of another embodiment of the present invention in a cascode power doubling linear amplifier.

Referring specifically to FIG. 3, identical elements as those shown in FIG. 2 are again connected in a similar fashion, however, a transistor 70 and a transistor 80 are added. Transistor 70 is connected to the circuit in an identical manner as transistor 40 and transistor 80 is connected to the circuit in an identical manner as transistor 50. While adding complexity to the amplifier these extra transistors permit power doubling amplification. Obviously, any number of in-phase output transistors such as transistors 40 and 70 can be cascoded to Darlington pair 20 and likewise any number of out-of-phase output transistors such as transistors 50 and 80 can be cascoded to Darlington pair 30.

The improvement achieved in linear amplification by utilizing Darlington cascode push pull amplifier 100 of FIG. 2 instead of conventional cascode push-pull amplifier 200 of FIG. 1 can best be illustrated by looking at some typical values of relevant charactertistics of the two amplifiers. The composite triple beat (CTB) of amplifier 100 with 60 interferring channels applied at +46 dBmV output per channel measured in a 439 MHz channel is typically −66 dB. The corresponding CTB characteristic in amplifier 200 with the same closed loop gain as amplifier 100 is typically −61 dB. This significant improvement in CTB is achieved as a result of increased open loop gain.

Cross modulation (XMOD) distortion measured at the same specifications as mentioned in the preceding paragraph is typically −68.2 dB in amplifier 100 and −64.7 dB in amplifier 200. This improvement in XMOD distortion is less dramatic when lower frequency channels are measured and, in fact, becomes a disadvantage at the far lower frequency range of channels. Regardless, the complete XMOD distortion characteristic of amplifier 100 is still a net advantage to designers more concerned with higher frequency channels instead of lower frequency channels.

The noise figure of amplifier 100 also is significantly better than the noise figure of prior art amplifier 200 when equivalent active devices are used. The noise figure measurements of amplifier 100 are typically: 3.8 dB at 50 MHz; 4.2 dB at 300 MHz; 4.7 dB at 300 MHz; 4.7 dB at 400 MHz; and 5.0 dB at 450 MHz; and 5.6 dB at 550 MHz. Comparative noise levels in conventional push pull amplifiers are: 4.5 dB at 50 Mhz; 4.9 dB at 300 MHz; 5.3 dB at 400 MHz; 5.6 dB at 450 MHz; and 6.1 db at 550 MHz.

The improvements depicted above are of great use in the CATV industry where less distortion and a decreased noise figure are required. Multi-channel transmission with clear reception is highly desired in the field and the use of the invented amplifier helps meet this desire.

While we have shown and described specific embodiments of this invention, further modifications and improvements will occur to those skilled in the art. We desire it to be understood, therefore, that this invention is not limited to the particular form shown and we intend in the appended claims to cover all modifications which do not depart from the spirit and scope of this invention.

What is claimed is:

1. An electrical circuit comprising a first Darlington pair configuration connected to an in-phase input activating node of a first cascoded device and a second Darlington pair configuration connected to an out-of-phase input activating node of a second cascode device, said first Darlington pair configuration and said second Darlington pair configuration being coupled to each other by a resistor.

2. An electrical circuit as recited in claim 1 additionally comprising a first coupled transformer having an input isolated winding capable of inducing power on an input isolated winding which has a first end connected to said in-phase input activating node and a second end connected to said out-of-phase input activating node.

3. An electrical circuit as recited in claim 2 which further comprises a first grounded capacitor coupled to said first end of said input connected winding and a second grounded capacitor coupled to said second end of said input connected winding.

4. An electrical circuit as recited in claim 1 wherein said in-phase input activating node has an R-C feedback circut coupled to a in-phase output node of said first cascoded device and said out-of-phase input activating node is R-C coupled to a out-of-phase output node of said second cascoded device.

5. An electrical circuit as recited in claim 4 additionally comprising a second coupled transformer having a split winding attached between said in-phase output node and said out-of-phase output node and further having a circuit output transformer winding.

6. An electrical circuit as recited in claim 5 further comprising means for applying a dc voltage source to said split winding.

7. An electrical circuit as recited in claim 1 wherein said electrical circuit is a push-pull amplifier.

8. An electrical circuit as recited in claim 1 wherein said electrical circuit is a power doubling amplifier.

9. An electrical circuit as recited in claim 1 wherein said first cascoded device is inversely symmetric to said second cascoded device.

10. A power amplifier circuit comprising:
a first Darlington pair including a first transistor and a second transistor each having a base, an emitter, and a collector;
a second Darlington pair including a third transistor and a fourth transistor each having a base, an emitter, and a collector;
a resistor connecting the emitters of said second and fourth transistors;
an input signal source capable of supplying signals of opposite polarity to the bases of said first transistor and said third transistor;
an in-phase output transistor cascoded to said first Darlington pair;
an out-of-phase output transistor cascoded to said second Darlington pair; and
a split winding connecting the collector of said in-phase output transistor to the collector of said out-of-phase output transistor.

11. A power amplifier circuit as recited in claim 10 wherein said input signal source is a transformer.

12. A power amplifier circuit as recited in claim 10 wherein said in-phase output transistor cascoded to said first Darlington pair is additionally RC feedback coupled to the base of said first transistor and said out-of-phase output transistor cascoded to said second Darlington pair is additionally RC feedback coupled to the base of said third transistor.

13. A power amplifier circuit as recited in claim 10 additionally comprising a first grounded resistor attached to the emitter of said first transistor and a second grounded resistor attached to the emitter of said third transistor.

14. A power amplifier circuit as recited in claim 10 additionally comprising a resistor connecting the emitters of said first and third transistors.

15. A power amplifier circuit comprising:
a first Darlington pair including a first transistor and a second transistor each having a base, an emitter, and a collector;
a second Darlington pair including a third transistor and a fourth transistor each having a base, an emitter, and a collector;
an input signal source capable of supplying signals of opposite polarity to the bases of said first transistor and said second transistor;
at least one capacitor attached to said input signal source;
a first resistor coupling the emitter of said second transistor and the emitter of said fourth transistor;
a second resistor connected between ground and the emitter of said first transistor;
a third resistor connected between ground and the emitter of said third transistor;
a fourth resistor coupling the emitter of said first transistor and the emitter of said third transistor;
an in-phase output transistor cascoded and R-C feedback coupled to said first Darlington pair, said in-phase output transistor having a base, an emitter, and a collector;
an out-of-phase output transistor cascoded and R-C feedback coupled to said second Darlington pair, said out-of-phase output transistor having a base, an emitter, and a collector;
a split winding connecting the collector of said in-phase output transistor to the collector of said out-of-phase output transistor;
a circuit output transformer winding electrically coupled to said split winding; and
means for connecting a dc voltage source, $V_{cc}$, to said split winding and also to the bases of said first transistor, said third transistor, said inphase output transistor and said out-of-phase output transistors.

* * * * *